(12) United States Patent
Schmidhammer

(10) Patent No.: US 10,033,350 B2
(45) Date of Patent: Jul. 24, 2018

(54) TUNABLE DUPLEXER HAVING A CIRCULATOR

(71) Applicant: Snaptrack Inc., San Diego, CA (US)

(72) Inventor: Edgar Schmidhammer, Stein an der Traun (DE)

(73) Assignee: SnapTrack, Inc., San Diego, CA (US)

( * ) Notice: Subject to any disclaimer, the term of this patent is extended or adjusted under 35 U.S.C. 154(b) by 0 days.

(21) Appl. No.: 15/120,481

(22) PCT Filed: Jan. 22, 2015

(86) PCT No.: PCT/EP2015/051223
§ 371 (c)(1),
(2) Date: Aug. 19, 2016

(87) PCT Pub. No.: WO2015/124368
PCT Pub. Date: Aug. 27, 2015

(65) Prior Publication Data
US 2017/0070203 A1    Mar. 9, 2017

(30) Foreign Application Priority Data
Feb. 20, 2014    (DE) .................. 10 2014 102 207

(51) Int. Cl.
*H01P 1/38*    (2006.01)
*H03H 7/46*    (2006.01)
(Continued)

(52) U.S. Cl.
CPC ............. *H03H 7/463* (2013.01); *H01P 1/213* (2013.01); *H01P 1/38* (2013.01); *H01P 1/383* (2013.01);
(Continued)

(58) Field of Classification Search
CPC .... H01P 1/38; H01P 1/36; H01P 1/383; H01P 1/387
(Continued)

(56) References Cited

U.S. PATENT DOCUMENTS 3,286,201 A    11/1966 Roberts
4,258,339 A    3/1981 Bernard et al.
(Continued)

FOREIGN PATENT DOCUMENTS

DE    102011111951 A1    5/2012
EP    1058334 A2    12/2000
(Continued)

OTHER PUBLICATIONS

International Search Report and Written Opinion—PCT/EP2015/051223—ISA/EPO—dated Apr. 17, 2015.
(Continued)

*Primary Examiner* — Stephen E Jones
(74) *Attorney, Agent, or Firm* — Patterson & Sheridan, L.L.P.

(57) ABSTRACT

A tunable duplexer is specified is disclosed. In an embodiment, the duplexer includes a transmission port, a reception port, a common port and a core having a first inductive element and a second inductive element. The duplexer further includes a first signal path electrically connecting the transmission port to the core, a second signal path electrically connecting the reception port to the core and a third signal path electrically connecting the common port to the core. A first tunable capacitive element electrically connects the first signal path to ground and a second tunable capacitive element electrically connects the second signal path to ground, wherein the first inductive element and the second inductive element are inductively and conductively coupled to one another.

10 Claims, 4 Drawing Sheets

(51) Int. Cl.
*H01P 1/383* (2006.01)
*H01P 1/213* (2006.01)
*H03H 7/52* (2006.01)
*H03H 7/01* (2006.01)
*H05K 1/02* (2006.01)

(52) U.S. Cl.
CPC ........ *H03H 7/0115* (2013.01); *H03H 7/1775* (2013.01); *H03H 7/52* (2013.01); *H05K 1/0237* (2013.01); *H03H 2210/012* (2013.01); *H03H 2210/025* (2013.01)

(58) Field of Classification Search
USPC .................................................. 333/1.1, 24.2
See application file for complete search history.

(56) References Cited

U.S. PATENT DOCUMENTS

| | | | |
|---|---|---|---|
| 6,169,912 B1 | 1/2001 | Zuckerman | |
| 6,657,513 B2 * | 12/2003 | Kawanami | H01P 1/387 333/1.1 |
| 2012/0112853 A1 | 5/2012 | Hikino et al. | |
| 2012/0256702 A1 | 10/2012 | Khlat et al. | |
| 2014/0169422 A1 | 6/2014 | Hayafuji et al. | |
| 2015/0061788 A1 | 3/2015 | Nakajima et al. | |

FOREIGN PATENT DOCUMENTS

| | | |
|---|---|---|
| JP | S5620322 A | 2/1981 |
| JP | H0593109 U | 12/1993 |
| JP | H09162774 A | 6/1997 |
| JP | 2000349508 A | 12/2000 |
| JP | 2012100180 A | 5/2012 |
| WO | 2013027580 A1 | 2/2013 |
| WO | 2013168771 A1 | 11/2013 |
| WO | 2014031369 A2 | 2/2014 |

OTHER PUBLICATIONS

Philips Semiconductors: "Circulators and Isolators, Unique Passive Devices," Application Note AN 98035, Mar. 23, 1998, 31 pages.

Stonies, R. et al., "Time Domain Analysis and Design of Lumped Element Circulators," IEEE Microwave Symposium Digest, Jun. 2006, pp. 544-547.

Young, J. et al., "Recent Advances in Bandwidth and Isolation Enhancement for VHF-UHF Lumped-Element circulators," IEEE International Symposium on Microwave, Antenna, Propagation and EMC Technologies for Wireless Communications, Oct. 2013, pp. 2-5.

* cited by examiner

TUNABLE DUPLEXER HAVING A CIRCULATOR

This patent application is a national phase filing under section 371 of PCT/EP2015/051223, filed Jan. 22, 2015, which claims the priority of German patent application 10 2014 102 207.6, filed Feb. 20, 2014, each of which is incorporated herein by reference in its entirety.

TECHNICAL FIELD

The invention relates to duplexers tunable in terms of frequency, as may be used e.g. in portable communication appliances.

BACKGROUND

Portable communication appliances, WLAN routers, etc., or more generally: transmission/reception devices that communicate by means of RF signals require an apparatus that separates the transmission signals and received signals from one another. In general, transmission signals are much stronger than received signals, which means that protection of the received signal path forms an important aspect of this apparatus. Duplexers are one way of implementing such separating apparatuses. In general, duplexers are in this case limited to frequency bands stipulated in advance. However, particularly against the background of the now large number of different frequency bands, it would be advantageous if a single duplexer could serve a plurality of frequency bands.

In this case, the duplexer is intended to perform the task of distributing the signals between a chipset and any filters that are still present. The circuit complexity should be as low as possible. The duplexer should be compatible with a multiplicity of different filter technologies, have a small physical size and, in particular, allow a high level of isolation between transmission signals and received signals.

Previous solutions for these requirements are essentially based on extending known duplexer circuits by tunable impedance elements, or on the use of switches by means of which filter elements are additionally connectable to a filter topology.

As such, the article "Reconfigurable Multi-band SAW Filters For LTE Applications", Xiao Ming et al., Power Amplifiers For Wireless And Radio Applications (PAWR), 2013 IEEE Topical Conference, Jan. 20, 2013, pages 82-84, discloses essentially conventional RF filters that are reconfigurable by means of switches. Filters reconfigurable by means of switches do not allow continuously tunable duplexers in this case, however.

The article "Tunable Filters Using Wideband Elastic Resonators", Kadota et al., IEEE Transactions on Ultrasonics, Ferroelectrics and Frequency Control, vol. 60, No. 10, October 2013, pages 2129-2136, discloses filter circuits in which tunable capacitors are added to RF filters with acoustic resonators.

The article "A Novel Tunable Filter Enabling Both Center Frequency and Bandwidth Tunability", Inoue et al., Proceedings of the $42^{nd}$ European Microwave Conference, Oct. 29-Nov. 1, 2012, Amsterdam, the Netherlands, pages 269-272, discloses RF filters with tunable capacitors and tunable inductances.

The article "RF MEMS-based Tunable Filters", Brank et al., 2001, John Wiley & Sons, Inc. Int J RF and Microwave CAE11: pages 276-284, 2001, discloses interconnections comprising L and C elements, wherein the capacitances of the capacitive elements are variable.

The article "Design of a Tunable Bandpass Filter with the Assistance of Modified Parallel Coupled Lines", Tseng et al., 978-1-4673-2141-9/13/$31.00, 2013 IEEE, discloses tunable filters with coupled transmission lines.

The article "Tunable Isolator Using Variable Capacitor for Multi-band System", Wada et al., 978-1-4673-2141-9/13/$31.00, 2013 IEEE MTT-S Symposium and the published specification WO02012/020613 disclose the use of isolators in RF filters.

In summary, it can essentially be stated for the RF circuits known from the aforementioned articles that known filter topologies tunable filter circuits are obtained by virtue of the addition of variable elements, e.g., switches or variable impedance elements. The problem with this is that the known filter topologies used are essentially optimized for the use of impedance elements with constant impedance. Although tunable filters are made possible, performance suffers as a result of the tunability.

SUMMARY OF THE INVENTION

Embodiments provide a novel circuit topology that affords good performance even when used with tunable circuit elements and in a large tuning range.

In various embodiments the duplexer comprises a transmission port, a reception port and a common port. The duplexer further comprises a core having a first and a second inductive element. A first signal path of the duplexer electrically connects the transmission port to the core. A second signal path of the duplexer electrically connects the reception port to the core. A third signal path of the duplexer electrically connects the common port to the core. The duplexer further comprises a first tunable capacitive element that electrically connects the first signal path to ground. A second tunable capacitive element of the duplexer electrically connects the second signal path to ground. The first inductive element and the second inductive element are inductively and conductively coupled to one another.

In this case, the core of the duplexer forms a circuit core and is then the center of the duplexer, via which the three ports are electrically connected to one another. The transmission port is suitable for receiving transmission signals from a circuit environment that are routed to the common port by the duplexer. The reception port is suitable for forwarding received signals to the circuit environment. In this case, the received signals can be received by the common port and routed to the reception port via the core. The common port is therefore suitable for forwarding transmission signals and receiving received signals. In this case, the common port may be electrically connected to one or more antennas essentially directly or indirectly.

Every single one of the three ports may in this case be designed to route balanced or unbalanced RF signals.

Such a duplexer allows both requirements concerning tunability and requirements concerning electrical properties, particularly isolation and selection, to be met.

In this case, the first tunable capacitive element and the second tunable capacitive element each have a capacitance that is variable. Both tunable capacitances may have an identical design and an identical tuning range. However, it is also possible for their design and/or their tuning range to differ from one another.

The tunable capacitive elements may in this case each be realized as tunable capacitance banks with a respective multiplicity of individually additionally connectable basic capacitances, switchable MEMS capacitances or varactors or further embodiments of tunable capacitance elements.

In one advantageous refinement, balanced signals can be output at least at the reception port.

In one embodiment, the first inductive element is electrically connected to the first signal path. The second inductive element is electrically connected to the second signal path.

The first inductive element and the second inductive element therefore form an important part of the duplexer core via which transmission signals can propagate from the transmission port and received signals can propagate to the reception port. The inductive and electrically conductive couplings via which the first signal path and the second signal path can communicate with one another are in this case embodied such that good isolation is obtained between the signal paths and at the same time the insertion losses for transmission signals to the shared signal path and received signals from the shared reception port are kept low.

The electrically conductive coupling of the two inductive elements to one another and the connection of the inductive elements to the relevant signal paths can be obtained e.g. by virtue of one end of the inductive elements being electrically connected to a central circuit node in the core of the duplexer. The other end of the inductive elements is then electrically connected to the relevant signal path directly. The two inductive elements are therefore each connected in series between the central circuit node and the relevant ports of the two signal paths.

The inductive coupling of the two inductive elements can be obtained by virtue of the inductive elements being embodied relative to one another in spatial terms such that each inductive element is arranged within a region that is penetrated by the magnetic field of the other inductive element when a current flows in this other inductive element.

The strength of the coupling can be set by the strength of the respective magnetic field. If both inductive elements have one or more loop-like conductor sections, then both coils may be arranged in relation to one another such that there is a common region of overlap between the loops.

In one embodiment, the first inductive element and the first tunable capacitive element together form a resonant circuit connected to ground. The resonant circuit is suitable for producing a resonance at a center frequency in a selectable transmission frequency band. The second inductive element and the second tunable capacitive element further form a second resonant circuit connected to ground that is suitable for producing a resonance at a center frequency in a selectable reception frequency band.

Particularly by virtue of the variability of the capacitances of the first and second tunable capacitance elements, the duplexer can be set for freely selectable transmission frequency bands and for freely selectable reception frequency bands. In this case, the choice of capacitance value for the first tunable capacitive element may be dependent on the frequency of the transmission frequency band and/or on the frequency of the reception frequency band. Accordingly, the capacitance value of the second tunable capacitive element may be dependent on the frequency of the reception frequency band and/or on the frequency of the transmission frequency band.

In one embodiment, the circuit core of the tunable duplexer is a circulator or an arrangement and interconnection of circuit components having the same electrical properties as a conventional circulator.

In this context, a circulator is understood to mean a circuit arrangement having three ports, with signal paths being arranged between each of the ports such that the other signal port is not part of the signal branch. One signal portion can therefore get to an adjacent port directly from each of the three ports. The other signal portion can then get to the actual destination port via an appropriate detour via the third port. In other words: when a signal flows from a port A to a port B, one signal portion takes the direct path while the other signal portion takes the detour via port C. In that case, the signal can leave the circulator essentially without attenuation when there is constructive interference between the two signal portions at port B. If there is destructive interference at port C, then the signal essentially cannot leave the circulator at port C.

In the present duplexer, the circuit elements in the core are therefore preferably arranged and electrically connected to one another such that for transmission signals that flow from the transmission port to the common port, there is a phase difference between the phases of signal portions of essentially 0°. Accordingly, there is a maximum phase offset of 180° between the signal portions of the transmission signals at the reception port.

It similarly applies to received signals that are meant to flow from the common port to the reception port that the phase difference between the signal portions is essentially 0°, while the phase offset for the corresponding signal portions at the transmission port is 180°.

Particularly because the inductive elements in the core of the duplexer are both electrically connected to one another and inductively coupled to one another, there is the possibility of splitting into signal portions, since a first signal portion can be produced by means of the electrical interconnection and the second signal portion can be produced by means of the inductive coupling.

In one embodiment, the duplexer comprises a third inductive element that is both inductively and conductively coupled to the first inductive element and the second inductive element. In this case, the third inductive element is electrically connected to the third signal path, e.g. in series between the common port and a possible central circuit node in the core.

In one embodiment, the duplexer comprises a series capacitive element that is electrically connected in series in the first signal path. In this or a further embodiment, the duplexer comprises a series capacitive element that is electrically connected in series in the second signal path. In these embodiments or in a further embodiment, the duplexer comprises a series capacitive element that is electrically connected in series in the third signal path.

Each of these three series capacitive elements can be used for fine adjustment and for DC isolation of relevant signal path sections.

In one embodiment, the duplexer comprises a series inductive element that is electrically connected in series in the first signal path. Alternatively or additionally, the second signal path may also contain a series inductive element electrically connected in series with the second signal path. Alternatively or additionally, the third signal path may also contain a series inductive element electrically connected in series.

The series inductive elements may be formed by explicitly existent conductor sections having at least one loop or by conductor sections without loops, e.g. segments of a bonding wire, flip chip connections or similar interconnection options.

Particularly with the aforementioned series capacitive elements, it is possible for the frequencies of the transmission frequency bands and/or of the reception frequency bands to be adjusted.

In one embodiment, the duplexer comprises a first LC parallel circuit that electrically connects the first signal path to ground. Alternatively or additionally, a second LC parallel circuit may be provided that electrically connects the second signal path to ground. Alternatively or additionally, a third LC parallel circuit may be provided that electrically connects the third signal path to ground.

In one embodiment, at least some of the inductive elements and capacitive elements of the duplexer are formed as patterned metallizations in a multilayer substrate.

BRIEF DESCRIPTION OF THE DRAWINGS

Aspects of the duplexer and some embodiments are explained in more detail below with reference to schematic figures, in which.

DETAILED DESCRIPTION OF ILLUSTRATIVE EMBODIMENTS

Figure 1:
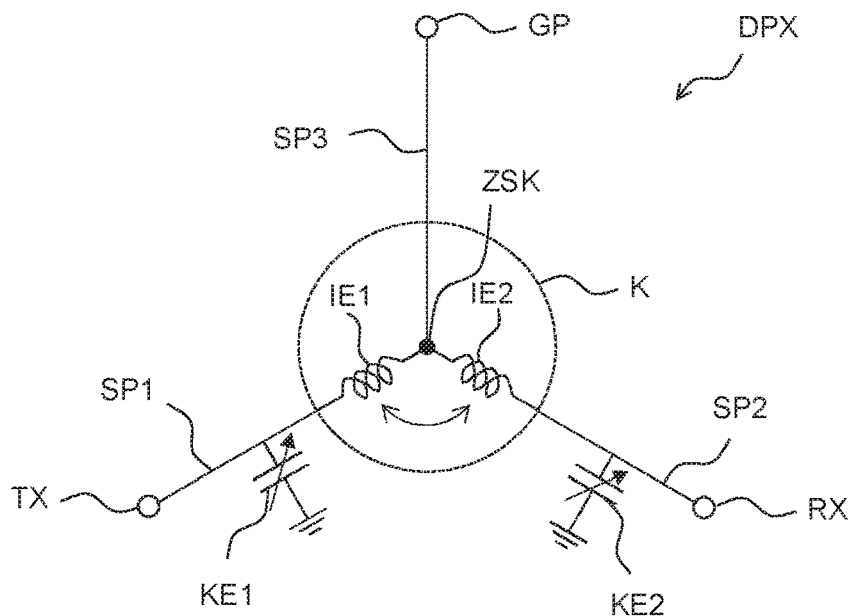
FIG. 1 shows an equivalent circuit diagram of a duplexer.

FIG. 1 essentially shows the equivalent circuit diagram of an embodiment of the duplexer DPX in which a central circuit core K essentially implements the interconnection of a transmission port TX, a reception port RX and a common port GP. In this case, the core K of the duplexer comprises the first inductive element IE1 and the second inductive element IE2. One side of each of the two inductive elements is electrically connected to one another at a central circuit node ZSK. The other ends of the inductive elements are electrically connected to the relevant sections of the signal paths to the relevant ports. As such, the first inductive element IE1 is electrically connected to the transmission port TX via the first signal path SP1. The second inductive element IE2 is electrically connected to the reception port RX via the second signal path SP2. The third signal path SP3 electrically connects the circuit core K to the common port GP. The third signal path SP3 is in this case likewise electrically connected to the central circuit node ZSK. The first signal path SP1 is electrically connected to ground via the first tunable capacitive element KE1. The second signal path is electrically connected to ground via the second tunable capacitive element KE2.

The curved arrow with two arrow tips symbolizes the inductive coupling of the two inductive elements IE1, IE2 in the circuit core K. In one specific circuit element, the two inductive elements IE1, IE2 of the duplexer DPX are arranged relative to one another such that the desired inductive coupling that is needed for operation of the duplexer DPX is obtained.

Figure 2:
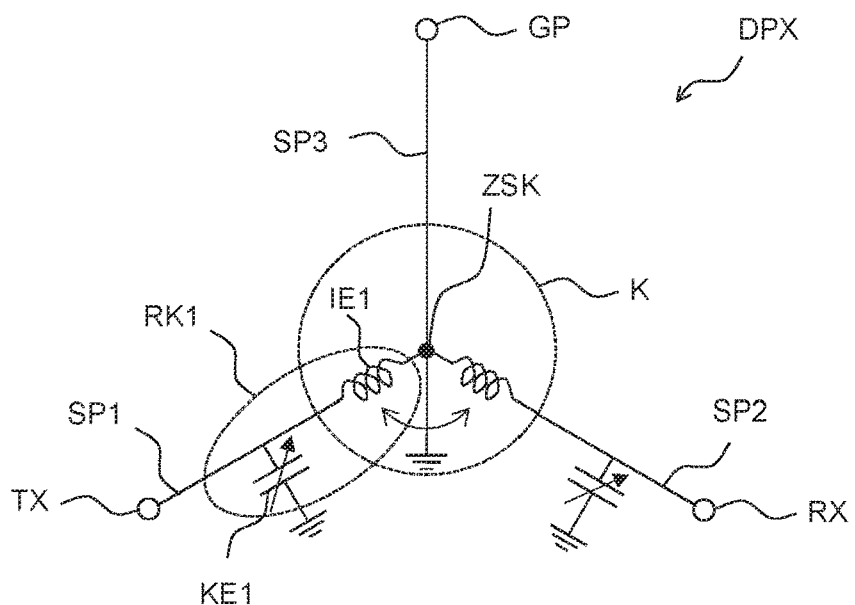
FIG. 2 shows a further possible embodiment of the duplexer.

FIG. 2 illustrates how the connection of the tunable capacitive elements to the relevant inductive elements in the circuit core K forms a resonant circuit in order to produce the insertion loss of the duplexer in the relevant frequency band. As such, a first resonant circuit RK1 comprising the first tunable capacitive element KE1 and the first inductive element IE1 forms a resonant circuit to ground in order to produce the insertion loss in the transmission frequency band. The central circuit node ZSK is likewise electrically connected to ground for this purpose.

Similarly, the second inductive element and the second tunable capacitive element form a resonant circuit in order to form the profile of the insertion loss in the reception frequency band.

Figure 3:
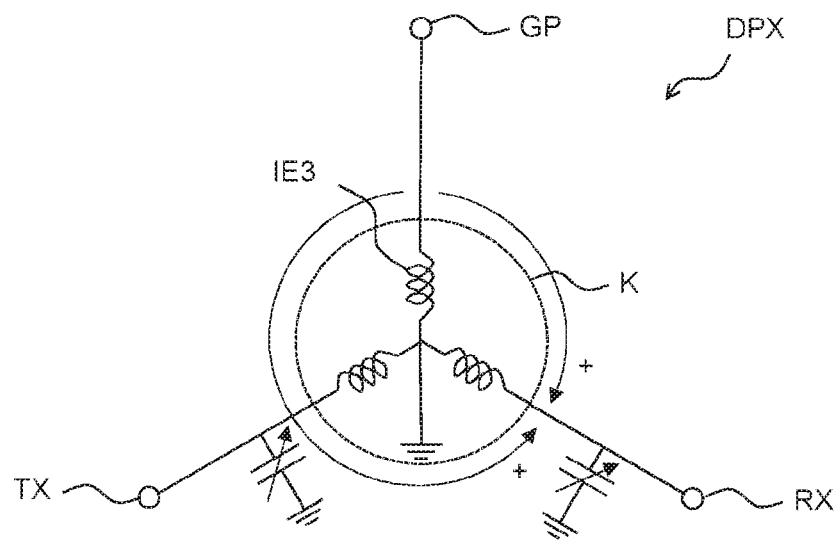
FIG. 3 shows the operation of the circulator.

FIG. 3 illustrates the operation of the circuit core K, which in this case is in the form of a circulator. The three inductive elements in the circuit core K are electrically connected to one another centrally, and inductively coupled to one another. As such, particularly each of the inductive elements is inductively coupled to each of the other two inductive elements. Received signals that are received from the common port GP and are intended to be routed exclusively to the reception port RX can be split into a signal portion that propagates in a clockwise direction and a signal portion that propagates in a counterclockwise direction. Both signal portions preferably have a tiny phase offset at the location at which the circuit core K is electrically connected to the second signal path to the reception port, as a result of which said signal portions are constructively superimposed. The phase of the signal portions at the transmission port results in destructive superimposition, on the other hand, as a result of which the received signals cannot leave the duplexer at the transmission port TX.

The same applies in a similar fashion to transmission signals that are coupled into the duplexer at the transmission port TX and interfere constructively at the common port GP, while the isolation is ensured by destructive interference at the reception port RX.

Selection of the capacitance values of the two tunable capacitive elements allows the relative phase to be set on the frequency-dependent basis such that the duplexer can operate at different transmission frequencies and at different reception frequencies.

Figure 4:
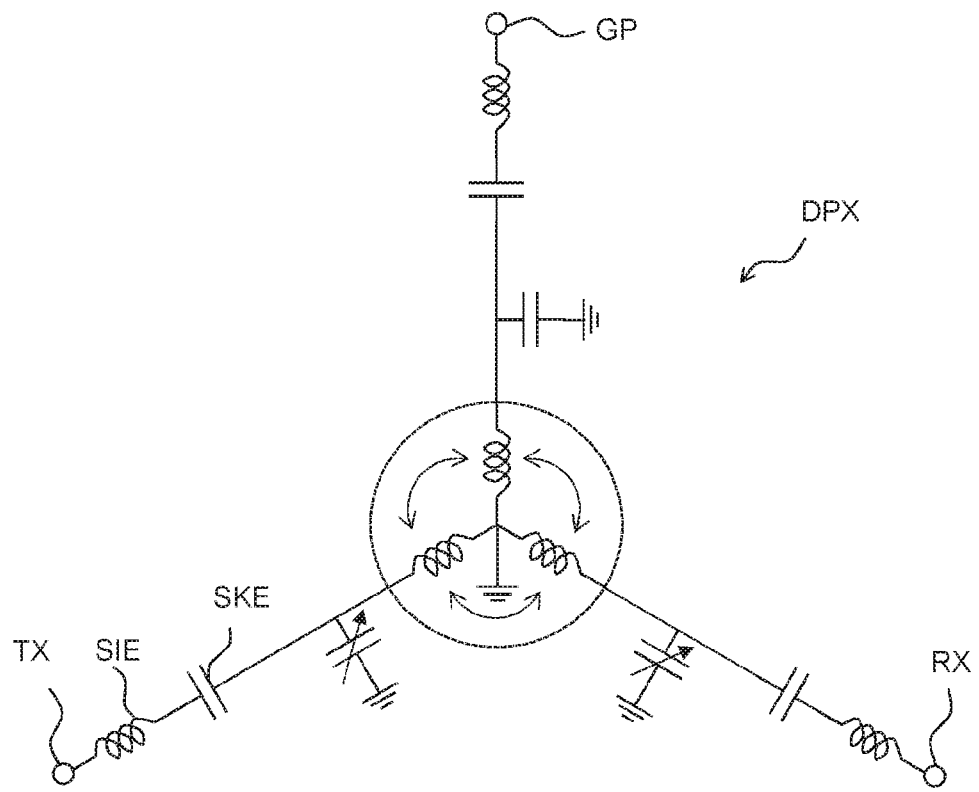
FIG. 4 shows a further possible refinement of the duplexer.

FIG. 4 shows an embodiment of the duplexer DPX in which each of the three signal paths contains a series capacitive element SKE and a series inductive element SIE electrically connected in series with one another and in series with the signal path. The symmetrical arrangement of the series inductive and capacitive elements is not absolutely necessary in this case. The three signal paths can together also comprise just a single inductive or capacitive element that is electrically connected in one of the three signal paths in each case. The provision of two capacitive or two inductive elements in each case that are distributed over the three signal paths is also possible.

Particularly the relevant series inductive element SIE may be embodied by conductor structures that serve to feed a signal to the duplexer.

Figure 5:
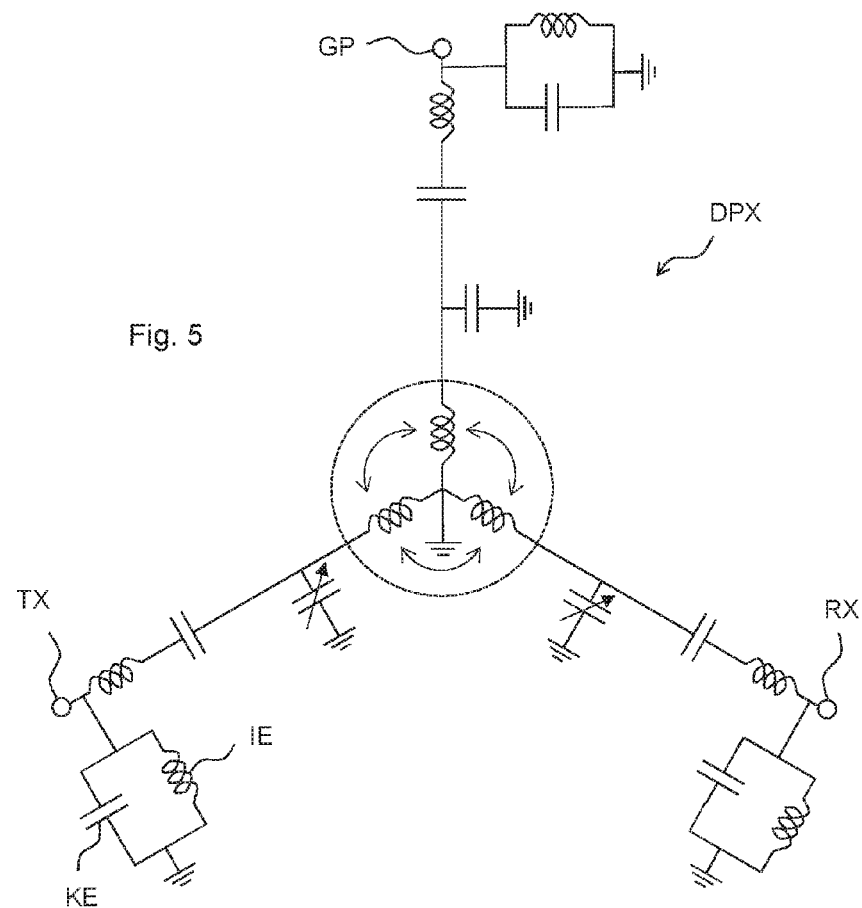
FIG. 5 shows a possible configuration of the duplexer with further circuit elements.

FIG. 5 shows an embodiment in which the signal paths additionally have their peripheral end electrically connected to ground via a parallel circuit comprising a capacitive element KE and an inductive element IE.

This may allow better matching of the duplexer to external circuit environments, particularly impedance matching.

The grounded inductive element at the common port GP also allows signals that have been caused by discharge of a static charge to be drained to ground such that the remainder of the circuit elements are not affected. In that case, the inductive element works an ESD protection element.

Figure 6:
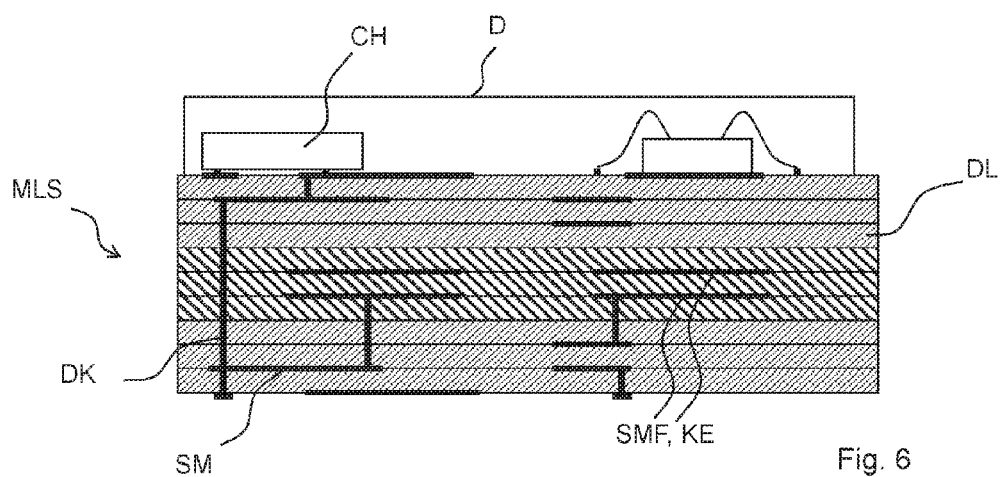
FIG. 6 shows a possible implementation of circuit elements in a multilayer substrate.

FIG. 6 shows the possibility of integrating circuit elements as patterned metallizations SM in a multilayer substrate MLS. As such, capacitive elements KE may be formed by patterned metallization areas SMF. Inductive elements may be formed by plated-through holes DK made linearly or made in a manner looped through the substrate layers. In this case, the different substrate layers are formed by dielectric layers DL, between which metallization layers are arranged. The top of the multilayer substrate MLS may have further circuit elements, e.g. discrete circuit elements such as coils or capacitive elements having a high Q factor, arranged on it. A cover D may be provided in order to cover the circuit elements on the top of the multilayer substrate MLS. The underside of the multilayer substrate MLS may be provided with pads that are used to connect up the duplexer as part of a frontend circuit to an external circuit environment of a communication appliance.

Figure 7:
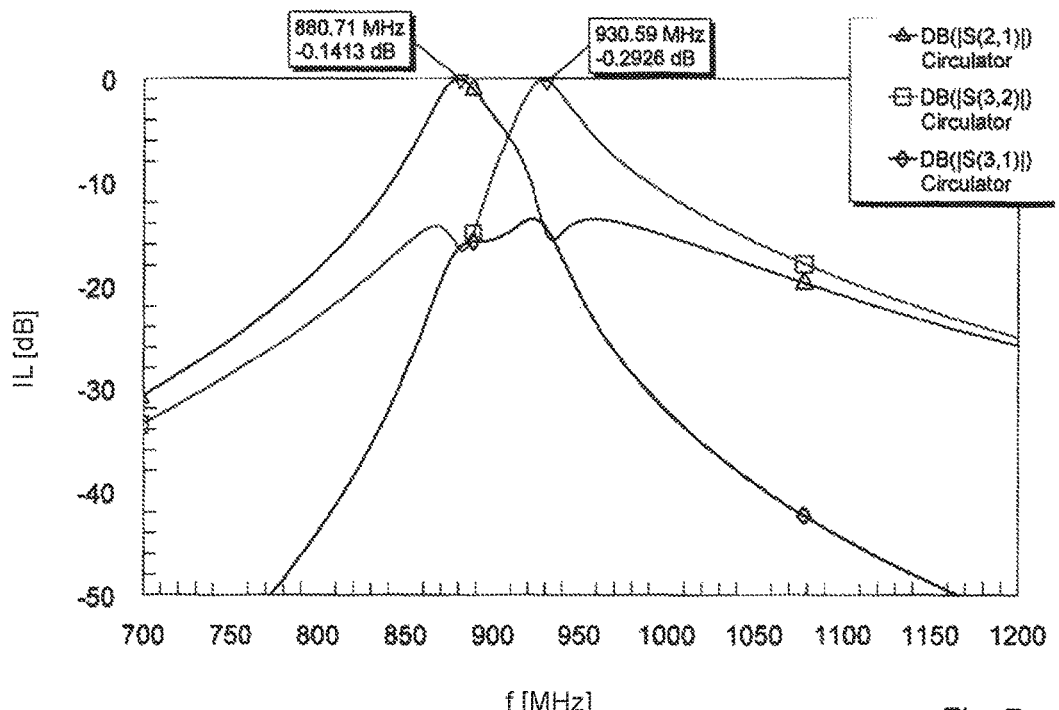
FIG. 7 shows electrical properties of a duplexer for a first set of selected operating frequencies.

FIG. 7 shows computed absolute values of the matrix elements $S_{2,1}$, $S_{3,2}$, $S_{3,1}$. As such, the curve marked by triangles shows the insertion loss for ($S_{2,1}$) for transmission signals that propagate from the transmission port TX to the common port GP. The center frequency of the transmission band is set to 880.71 MHz in this case. The center frequency of the reception band is set to 930.59 MHz. The duplexer is thus set such that it operates at the frequencies of the FDD (FDD=Frequency Division Duplexing) band 8. The lowest insertion loss in the transmission band is 0.141 dB in this case. The lowest insertion loss in the reception band is 0.293 dB. The isolation between transmission signal path and received signal path is always better than 12 dB in this case.

Figure 8:
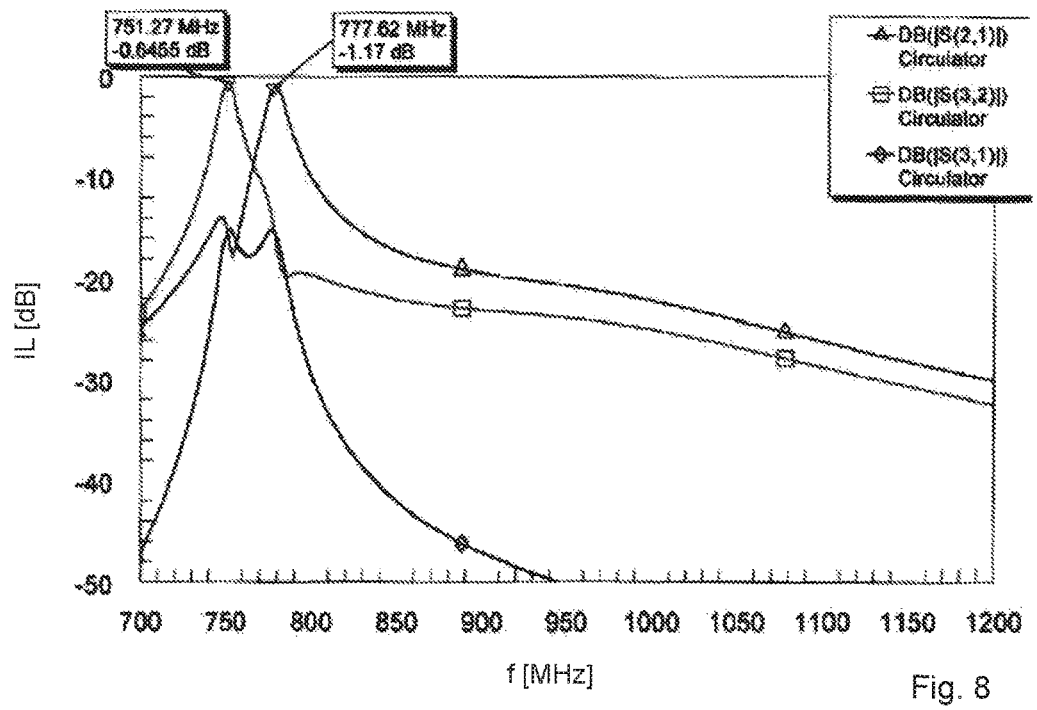
FIG. 8 shows electrical properties of the duplexer from FIG. 7 with a second set of selected operating frequencies.

FIG. 8 shows the corresponding computed values for the frequencies of the FDD band 13. In this case, the transmission frequencies (center frequency 777.2 MHz) are above the reception frequency band (center frequency 751.27 MHz). The minimum insertion losses are 1.17 dB in the transmission frequency band and 0.65 dB in the reception frequency band.

FIGS. 7 and 8 show instances of the same duplexer being matched to different frequency bands in this case, the orientations of transmission signal band and received signal band in relation to one another being reversed: when the transmission frequency band is below the reception frequency band in band 8, the transmission frequency band is above the reception frequency band in band 13.

For conventional tunable duplexers, it is almost impossible in this case to deal with frequency bands having transposed transmission frequencies and reception frequencies and at the same time to have such low insertion losses.

In this case, the tunable duplexers are not limited to the embodiments described or shown. Further embodiments with additional circuit elements in the circuit core or in the signal paths or duplexers whose signal ports have further filter circuits connected to them are likewise covered.

The invention claimed is:

1. A tunable duplexer comprising:
a transmission port;
a reception port;
a common port;
a core having a first inductive element and a second inductive element;
a first signal path electrically connecting the transmission port to the core;
a second signal path electrically connecting the reception port to the core;
a third signal path electrically connecting the common port to the core;
a first tunable capacitive element that electrically connects the first signal path to electric ground;
a second tunable capacitive element that electrically connects the second signal path to the electric ground, wherein the first inductive element and the second inductive element are inductively and conductively coupled to one another;
a first inductor-capacitor (LC) parallel circuit that electrically connects the first signal path to the electric ground;
a second LC parallel circuit that electrically connects the second signal path to the electric ground; and
a third LC parallel circuit that electrically connects the third signal path to the electric ground.

2. The tunable duplexer according to claim 1, wherein the core is a circulator.

3. The tunable duplexer according to claim 1, further comprising a third inductive element inductively and conductively connected to the first inductive element, wherein the third inductive element is inductively and conductively connected to the second inductive element, and wherein the second inductive element is electrically connected to the third signal path.

4. The tunable duplexer according to claim 1, further comprising a third capacitive element that electrically connects the third signal path to the electric ground.

5. The tunable duplexer according to claim 1, further comprising:
a series capacitive element that is electrically connected in series in the first signal path;
a series capacitive element that is electrically connected in series in the second signal path; and
a series capacitive element that is electrically connected in series in the third signal path.

6. The tunable duplexer according to claim 1, further comprising:
a series inductive element that is electrically connected in series in the first signal path;
a series inductive element that is electrically connected in series in the second signal path; and
a series inductive element that is electrically connected in series in the third signal path.

7. The tunable duplexer according to claim 1, the first and second inductive elements and the first and second tunable capacitive elements are formed as patterned metallizations in a multilayer substrate.

8. The tunable duplexer according to claim 1, further comprising a series capacitive element electrically connected in series in the third signal path.

9. The tunable duplexer according to claim 1, wherein the first inductive element is electrically connected to the first signal path and the second inductive element is electrically connected to the second signal path.

10. The tunable duplexer according to claim 9, wherein the first inductive element and the first tunable capacitive element form a resonant circuit connected to the electric ground that is suitable for producing a resonance at a center frequency in a selectable transmission frequency band, and wherein the second inductive element and the second tunable capacitive element form a resonant circuit electrically connected to the electric ground that is suitable for producing a resonance at a center frequency in a selectable reception frequency band.

* * * * *